(12) United States Patent
Hardy et al.

(10) Patent No.: US 7,532,993 B2
(45) Date of Patent: May 12, 2009

(54) DEVICE PROVIDING TRIM VALUES

(75) Inventors: Remi Hardy, Mouans Sartoux (FR); Vincent Rezard, Villeneuve Loubet (FR)

(73) Assignee: Infineon Technologies AG, Nuebiberg (DE)

( * ) Notice: Subject to any disclaimer, the term of this patent is extended or adjusted under 35 U.S.C. 154(b) by 0 days.

(21) Appl. No.: 11/678,858

(22) Filed: Feb. 26, 2007

(65) Prior Publication Data

US 2008/0204119 A1 Aug. 28, 2008

(51) Int. Cl.
*G01R 35/00* (2006.01)
(52) U.S. Cl. ...................................... 702/107
(58) Field of Classification Search ............. 702/106, 702/107; 327/141, 162; 365/96, 189.01, 365/225.7; 331/44, 57
See application file for complete search history.

(56) References Cited

U.S. PATENT DOCUMENTS

| | | | | |
|---|---|---|---|---|
| 6,396,759 B1 * | 5/2002 | Lesher | ...................... | 365/225.7 |
| 7,096,137 B2 * | 8/2006 | Shipton et al. | ............... | 702/106 |
| 2006/0245232 A1 * | 11/2006 | Kohara | ......................... | 365/96 |

* cited by examiner

*Primary Examiner*—Bryan Bui
(74) *Attorney, Agent, or Firm*—Lee & Hayes, PLLC

(57) ABSTRACT

Devices including trimmable electric units and methods for providing trim values to electric units. A device includes a trimmable electric unit, at least one fuse to provide at least one first trim value, and a trim value provision unit to provide at least one second trim value, and a register. The register, which is connected to the electric unit, the at least one fuse, and the trim value provision unit, selectively stores the first and/or the second trim values and provides them to the electric unit.

29 Claims, 3 Drawing Sheets

DEVICE PROVIDING TRIM VALUES

FIELD OF THE INVENTION

The invention concerns a device and a method for the provision of trim values to a trimmable electric unit.

BACKGROUND OF THE INVENTION

Many electric units need to be trimmed in order to deliver performance parameters given by the specifications of the electric unit. After simulating and optimizing the trimming, the optimized trim values are permanently implemented in the electric unit. For the case of semiconductor devices, these processes are usually performed at a wafer probe stage using automatic test equipment.

BRIEF SUMMARY OF THE INVENTION

The following presents a simplified summary of the present invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

According to an embodiment, a device comprises a trimmable electric unit, at least one fuse to provide at least one first trim value, and a trim value provision unit to provide at least one second trim value and a register. The register, which is connected to the electric unit, the at least one fuse, and the trim value provision unit, selectively stores the first and/or the second trim values and provides them to the electric unit.

According to a further embodiment, a device comprises a trimmable electric unit, at least one fuse to provide at least one first trim value, and a trim value provision unit to provide at least one second trim value and a control unit. The control unit controls which of the first and/or the second trim values are provided to the electric unit.

To the accomplishment of the foregoing and related ends, the following description and attached drawings set forth in detail certain illustrative aspects and implementations of the present invention. These are indicative of but a few of the various ways in which one or more aspects of the present invention may be employed. Other aspects, advantages, and novel features of the invention will become apparent from the following detailed description of the invention when considered in conjunction with the annexed drawings.

DETAILED DESCRIPTION OF THE INVENTION

Figure 1:
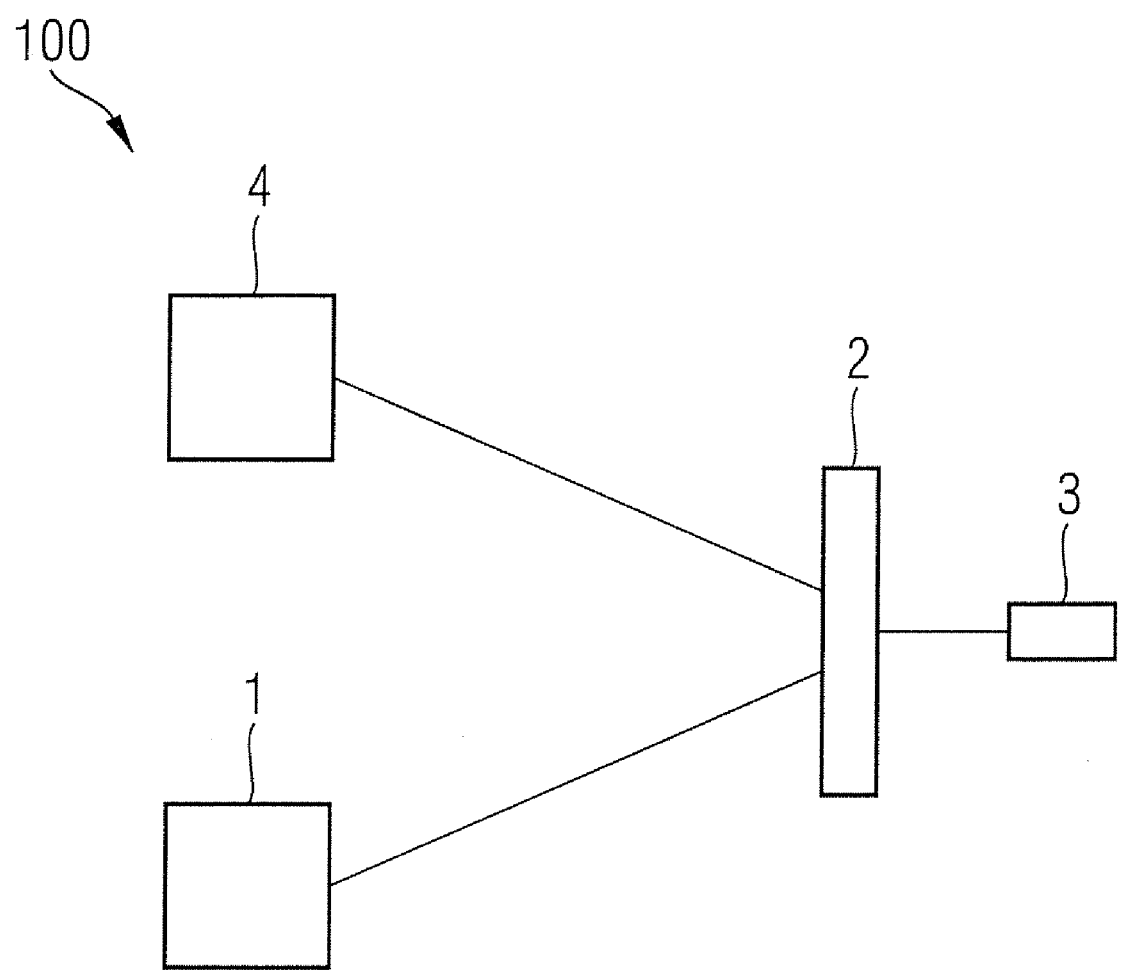
FIG. 1 illustrates a block diagram of a first embodiment of a device for providing trim values for a trimmable electric unit.

In the following embodiments are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of embodiments. It may be evident, however, to one skilled in the art that one or more aspects of the embodiments may be practiced with a lesser degree of these specific details. In other instances, known structures, and devices are shown in block diagram form in order to facilitate describing one or more aspects of the embodiments of the invention. The following description is therefore not to be taken in a limiting sense, and the scope of the invention is defined by the appended claims.

In the following description, devices comprising trimmable electric units are described which, for example, may be any kind of analog or digital circuitry. Examples of such electric units are voltage references, operational amplifiers, battery monitors, data converters, or memory units. The invention, however, is independent of the specific type of electric unit in which the invention is included.

The devices further comprise at least one fuse to provide at least one trim value. The scope of the invention is not restricted to the specific type of the employed fuses. Examples of applicable fuses are electrical fuses, such as silicided and non-silicided polysilicon fuses, conventional metal fuses or laser blown fuses.

In addition, the devices comprise a trim value provision unit, whose embodiment is arbitrary and does not restrict the scope of the present invention. The trim value provision unit may be any kind of device providing analogue or digital data capable to represent trim values. An example of such a trim value provision unit is a controller, in particular a microcontroller, providing bit sequences.

In the following description of the accompanying drawings, identical or similar parts are labelled with the same reference signs.

FIG. 1 shows a block diagram of a device 100 representing a first embodiment. The device 100 comprises a trimmable electric circuit 1, the specifications of which can be altered via provided trim values. The electric unit 1 is connected to a register 2, which in turn is connected to at least one fuse 3 capable of providing at least one first trim value. (In the following, the singular case for the at least one trim value is used, although the case of multiple first trim values is explicitly included. The same holds for the at least one second, third and fourth trim values mentioned in text passages below.) The first trim value determined by the fuse 3 can be stored in the register 2 and can be provided from the register 2 to the electric unit 1. The register 2 is further connected to a first trim value provision unit 4, which is able to provide at least one second trim value. The first trim value provision unit 4 can write the second trim value into the register 2, from where it can be provided to the electric unit 1.

In conventional production processes of electric units 1, such as semiconductor devices, these devices have to be trimmed in order to deliver specified performance parameters. Before a trimming of the electric unit 1 is made permanent, different trimming situations are simulated by applying them externally. After measuring the effects of these trimming situations, the trimming is optimized and then made permanent. One example of such an optimization of trim values is the programming of fuses, which are blown after an optimal trim value has been identified.

Concerning the case of semiconductor devices, this trimming simulation is usually performed at the wafer probe stage. During said wafer probe stage, the individual integrated circuits on the wafer are tested for functional defects by applying test patterns. The equipment used for this testing procedure is usually referred to as automatic test equipment (ATE). For integrated circuits, whose parameters do not lie within their desired specifications, the trim values may be altered and made permanent, thereby bypassing functional defects of the circuits that emerge due to erroneous fabrication of the wafer. Such a trimming simulation may, for example, be employed by using pad multiplexing and serial or parallel loading interfaces.

During a further step in the production flow, the wafer is diced into multiple dies, which are then sent to the lab to undergo a debugging process of the overall functionality of the semiconductor device in a process commonly termed "on-chip debug." This debugging process is carried out by a unit usually referred to as on-chip debug system (OCDS). In practice, it may result that the test program used by the ATE and at the wafer probe stage is not yet ready or available, which consequently leads to a delay of the trimming and fusing and, accordingly, of the overall production flow. This delay may result in an increase of production costs. It is therefore desirable to provide possibilities of an on-chip debug—at least for some samples of the semiconductor chip/device—without the semiconductor devices being already trimmed and fused during the wafer probe stage. Such possibilities would then allow for running and debugging the device samples in the lab as soon as the first samples are produced, regardless of whether the ATE test program being available and the device being fused. As a result, the debugging and the first evaluation of the device are accelerated, and the increase of production costs due to delays at the wafer probe stage is reduced.

Advantageously, the device 100 is capable of avoiding issues described by the following two cases. In a first case, the fuse 3 has already blown, and the determined first trim value determined from the blowing of the fuse 3 can be stored in the register 2. The situation may occur that the fuse 3 is unreliably or incorrectly blown, but the provision of a correct trim value to the electric unit 1 is still desired. In this case, the trim value provision unit 4 is able to simply overwrite the data representing the first trim value stored in the register 2. This way, the unwanted first trim value is simply bypassed or overwritten by a second trim value, which may depend on debug or test requirements. The second trim value written to the register 2 by the trim value provision unit 4 can then be sent to the electric unit 1. In a manner of speaking, the trim value provision unit 4 simply forces the desired second trim value to be provided to the electric unit 1.

In a second case, the fuse 3 has not yet blown, thus, no first trim value determined by blowing of the fuse 3 can be provided to the electric unit 1. There is however the possibility for the trim value provision unit 4 to write a second trim value into the register 2. Similar to the first case, the second trim value can then be sent to the electric unit 1.

It is understood that the second trim value provided by the trim value provision unit 4 can be generated and controlled in any possible manner. One concrete example is a microcontroller unit controlled by software that also offers the feature of an external control of the provided second trim value. The software may, for example, be programmed or controlled by the OCDS. The second trim value provided by the trim value provision unit 4 may also be hard-coded. In this case, the trim value provision unit 4 may, for example, read the second trim value from a corresponding memory device and write it into the register 2. Further possibilities may also comprise pad multiplexing and serial or parallel loading interfaces for the provision of the second trim values.

Due to the advantages mentioned above, semiconductor devices do not have to pass the wafer probe stage process of trimming and fusing before they can be sent to the lab for evaluation. In other words, the device 100 offers the possibility of debugging blind assemblies, i.e., completely untested devices. Even in the case of the electric unit 1 already being trimmed and fused, the device 100 offers the possibility to bypass the first trim values determined by the fuses 3 via second trim values provided by the first trim value provision unit 4. Correspondingly the debug of the electric unit 1 is eased by the bypass of unpredictable and uncontrollable first trim values.

Figure 2:
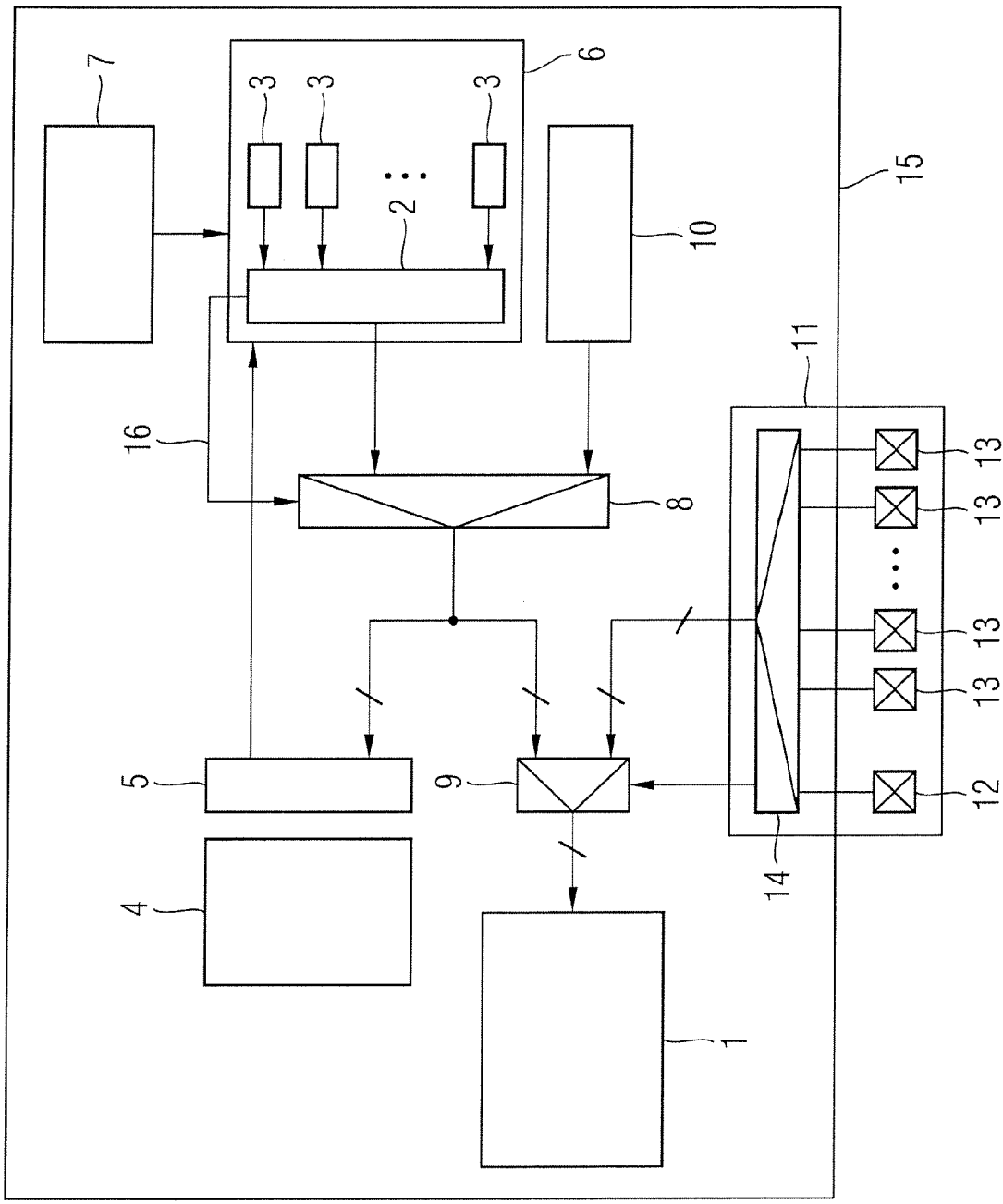
FIG. 2 illustrates a block diagram of a second embodiment of a device for providing trim values.

FIG. 2 shows a block diagram of a device 200 representing a second embodiment. The device 200 comprises a first trim value provision unit 4, which may be represented by a microcontroller unit controlled by software. A register 2 can be addressed via a bus peripheral interface 5, which enables the trim value provision unit 4 to write at least one second trim value into the register 2. The register 2 together with a set of fuses 3 form a fuse box 6, which is connected to a sensing unit 7. The fuses 3 are capable of determining at least one first trim value, which may be stored in the register 2. The sensing unit 7 may be implemented by an arbitrary hardware unit capable of sensing the fuses 3. For example, said sensing may be performed during the initialization period of the device 200 that starts when the device 200 is switched on. Further, the sensing unit 7 may also be capable of programming the fuses 3. Similar to the case of the device 100 (FIG. 1), the trim value provision unit 4, and the software that controls the same, is capable to directly access the register 2 over the bus peripheral interface 5 and write second trim values into the register 2 regardless of whether the fuses 3 have been blown. Thus, the first trim value determined by the fuses 3 may be bypassed or overwritten at any desirable time. Note that the present invention offers the advantage of simply using the register 2, which serves as a fuse box shadow to be accessed by the trim value provision unit 4. Accordingly, no further registers are required for an implementation of the present invention.

The register 2 is further connected to a control unit 8, which in the case of FIG. 2 is represented by a first multiplexer 8. It is understood, however, that the implementation of the control unit 8 may be arbitrary. For example, the control unit 8 may be implemented using either analog or digital selection circuits. Over a second multiplexer 9 the register 2 is further connected to a trimmable electric circuit 1. The specific functions of the two multiplexer 8 and 9 are described below. The device 200 additionally comprises a second trim value provision unit 10 capable of providing at least one third trim value, which is predetermined and may be hard coded. The implementation of the second trim value provision unit 10 is arbitrary and may for example be provided by a unit that simply reads the third trim value from a read only memory (ROM). The second trim value provision unit 10 is directly connected to the first multiplexer 8 and further connected to the electric unit 1 over the second multiplexer 9.

The device 200 further comprises a third trim value provision unit 11 to provide at least one fourth trim value. The third trim value provision unit 11 represents a device used for the above mentioned trimming simulation at the wafer probe stage, where, for example, it may be connected to the ATE. The third trim value provision unit 11 may employ pad multiplexing, serial or parallel loading interfaces, or blown fuses to achieve said trimming simulation. In FIG. 2 the third trim value provision unit 11 comprises a trim source selection unit 12, with pads or fuses 13 providing the fourth trim value and a third multiplexer 14. The fourth trim value, which may be used for the wafer test simulation, can be accessed in parallel in order to reduce the test time. The third multiplexer 14 is connected to the second multiplexer 9 and controls which of the fourth trim values is provided to the electric unit 1. The trim source selection unit 12 selects the input of the multiplexer 9, which may include either the fourth trim value from the pads 13 or the trim value provided by the multiplexer 8.

A common substrate, on which a portion of the above described device components are monolithically integrated, is represented by a square 15 enclosing a portion of the described elements. Preferably, a device according to the present invention may be implemented as a system-on-chip device, i.e., a device with all of its components integrated in one single circuit on one common substrate.

Similar to the device 100, the device 200 offers a straightforward provision of second trim parameters via the first trim value provision unit 4 by directly accessing and overwriting the register 2. On one hand, this overwriting of the register 2 may happen before the fuses 3 are blown, i.e., it allows an on-chip debug before the wafer probe stage is accomplished. On the other hand, a trim value may also be provided to the electric unit 1 in case the fuses 3 are unreliably or incorrectly blown.

As already mentioned above, the sensing unit 7 senses the first trim value provided by the fuses 3 during an initialization period. During this sensing, the data representing the first trim value determined by the fuses 3 are successively read into the register 2. Obviously, the first trim value determined by the fuses 3 cannot be provided to the electric unit 1 before the corresponding data has been sensed completely. It is therefore desirable to provide at least one predetermined third trim value, which can be sent to the electric unit 1 as long as the first trim value is not available. This issue is solved by the second trim value provision unit 10 providing the third predetermined trim value. The third trim value is sent to the first multiplexer 8, whose state is chosen to select the third trim value and provide it to the electric unit 1 as long as the first trim value is not available due to the unfinished sensing process. At the moment the first trim value is sensed and ready to be sent to the first multiplexer 8, the state of the first multiplexer 8 is switched by a signal 16. After the switching, the first multiplexer 8 selects the first trim value to be provided to the electric unit 1. Note that the trim value chosen by the multiplexer 8 can also be sent back to the trim value provision unit 4.

Advantageously, the device 200 can be used in any integrated circuit comprising internal circuitry that requires post-assembly trimming, such as a trimming of the electric unit 1 after the dicing of the wafer, to be fixed permanently by fuses. As one specific example, the device 200 may represent an integrated circuit with an embedded power management unit including a band gap which needs to be trimmed accurately with the trimming to be permanently fused afterwards. As already indicated above, people in charge of the on-chip debug may receive samples which have not yet been fused because the test program of the ATE is not yet ready. The device 200 offers the possibility to avoid this problem by providing a trim value via the first trim value provision unit 4 so that debugging can be commenced without delay, thereby allowing for detection of functional defects of the electric unit 1 as soon as possible.

Figure 3:
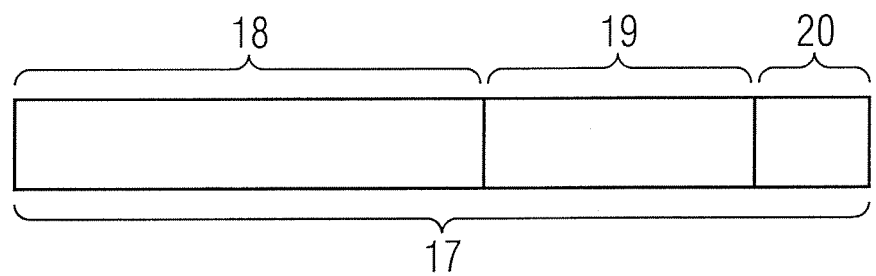
FIG. 3 shows a bit sequence used in controlling the application of trim values.

The direct access to the register 2 via software holds the risk of the register 2 being written or overwritten by mistake, which would in turn result in an erroneous second trim value being provided to the electric unit 1. Therefore, it is preferable to hide the possibility of overwriting the register 2 from a customer. One possibility to avoid such erroneous overwriting can be achieved by the first trim value provision unit 4 providing a control value to control whether the third trim value is provided to the electric circuit 1. This additional control feature can be realized by introducing an enable key. For an explanation of this key protection, FIG. 3 shows a bit sequence 17 comprising a sub-sequence 18 representing a trim value, a sub-sequence 19 reserved for additional arbitrary data and a sub-sequence 20 representing an enable key. The lengths of the three sub-sequences 18, 19 and 20 are basically arbitrary, but it is understood that they are restricted to the specific embodiment of the first trim value provision unit 4, the bus peripheral interface 5, and further units of the device 200. One example is the employment of a 16-bit architecture, which obviously would restrict the lengths of the sub-sequences 18, 19 and 20. In a 16-bit architecture, the sub-sequences 18, 19 and 20 may, for example, have the lengths of 10, 4 and 2 bits, respectively.

The first feature provided by the enable key was already mentioned above and concerns the switching of the first multiplexer 8 after the first trim value has been sensed. During the fuse sensing, the fuses are sensed sequentially, which provides the risk of a toggling output value until the sensing is completely finished. In case of an incompletely sensed first trim value, this would result in providing wrong data to the electric unit 1. In order to avoid this possible error, the sub-sequence 20 is sensed at the end of the sensing procedure and the first multiplexer 8 only switches from a selection of the predetermined third trim value to a selection of the first trim value if the sub-sequence 20 has been sensed and detected as valid. The sub-sequence 20 could for example consist of 2 bits with the bit values 00, 01 and 11 representing an invalid detection and a bit value of 10 representing a valid detection.

The second feature provided by the enable key is protection against unwanted write operations into the register 2. For example, the first trim value provision unit 4 can be configured so that it only writes a first trim value to the register 2 if the output of the first trim value provision unit includes the bit sequence 17. In other words, the software that controls the first trim value provision unit 4 needs to introduce the enable key in the provided bit sequence along with the first trim value. The need of introducing the enable key to each first trim value therefore avoids unwanted write operations into the register 2.

Figure 4:
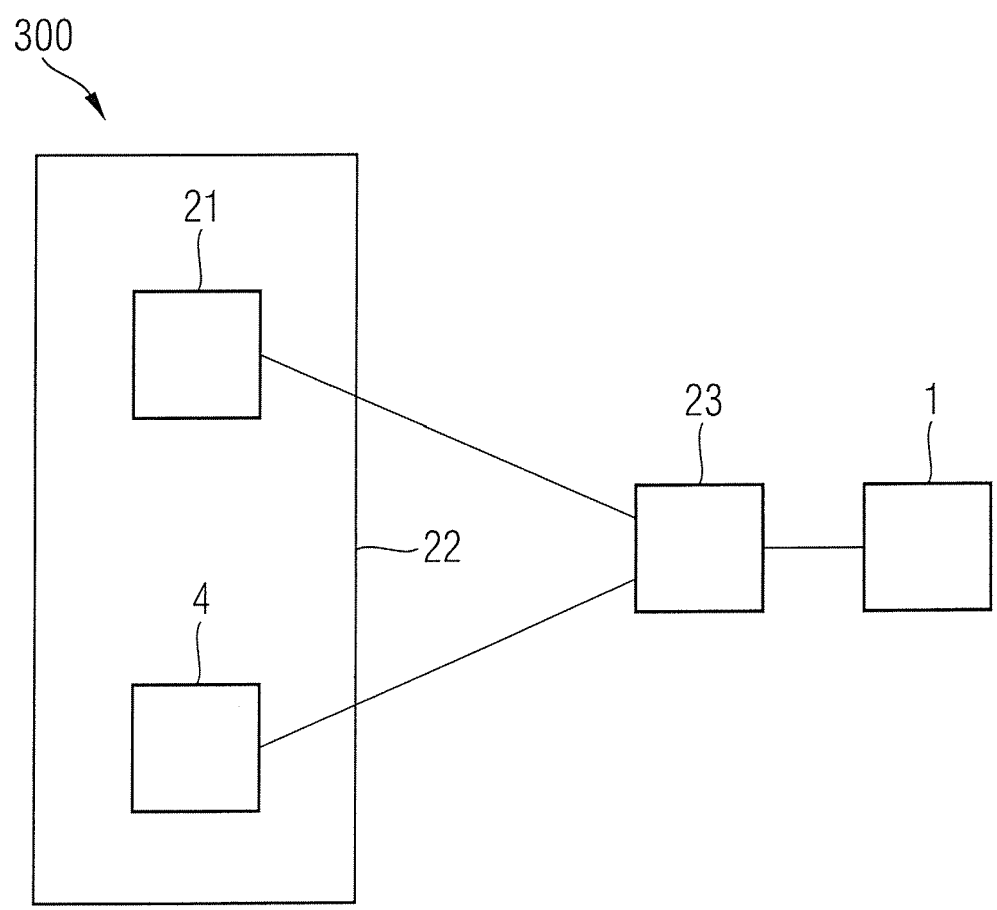
FIG. 4 shows a block diagram of a third embodiment of a device for providing trim values for a trimmable electric unit.

FIG. 4 shows a block diagram of a device 300 representing a third embodiment. The device 300 comprises at least one fuse 21 to provide at least one first trim value and a first trim value provision unit 4 to provide at least one second trim value. The fuse 21 and the trim value provision unit 4 are monolithically integrated on a substrate 22. Further, they are both connected to a control unit 23, which in turn is connected to a trimmable electric unit 1. The control unit 23 controls which of the first and second trim value is provided to the electric unit 1.

The device 200 illustrated in FIG. 2 represents an implementation of the device 300 shown in FIG. 4. The device 200 comprises at least one fuse 3, a first trim value provision unit 4 and a trimmable electric unit 1. The device 200 does not comprise an explicit control unit in terms of an explicitly illustrated block within the block diagram of FIG. 2. In case of the device 200, the control unit used by the device 300 is not given by an individual selection circuit or a multiplexer. It is rather identical to the first trim value provision unit 4, which simply overwrites the first trim value and thereby forces the electric unit 1 to be trimmed with the second trim value. Since the decision as to which of the first and/or second trim values are provided to the electric unit 1 is simply identical to the decision if the first trim value provision unit 4 overwrites the register 2, the first trim value provision unit 4 can be interpreted as a control unit.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." The terms "coupled" and "connected," along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A device comprising:
   a trimmable electric unit;
   at least one fuse to provide at least one first trim value;
   a first unit to provide at least one second trim value; and
   a register connected to the electric unit, the at least one fuse, and the first unit, to store the first trim value in a first operating mode, to store the second trim value in a second operating mode and to provide the trim values to the trimmable electric unit.

2. The device according to claim 1, further comprising a second trim value provision unit to provide at least one third predetermined trim value.

3. The device according to claim 2, further comprising a control unit to control when the at least one third trim value is provided to the trimmable electric unit.

4. The device according to claim 1, further comprising a sensing unit to sense the at least one trim value stored in the least one fuse.

5. The device according to claim 4, wherein the sensing unit senses the at least one trim value stored in the at least one fuse during an initialization period.

6. The device according to claim 2, wherein during the initialization period the at least one third trim value is provided to the trimmable electric unit.

7. The device according to claim 2, wherein the first trim value provision unit further provides a control value to control if the at least one third trim value is provided to the trimmable electric unit.

8. The device according to claim 1, wherein the device is an on-chip debug system.

9. The device according to claim 1, wherein the device further comprises a third trim value provision unit using pad multiplexing or blown fuses to provide at least one fourth trim value to the trimmable electric unit.

10. A method comprising:
    providing at least one fuse to provide at least one first trim value;
    providing a unit to provide at least one second trim value;
    storing the first trim value in a first operating mode and the second trim value in a second operating mode; and
    providing the trim values to a trimmable electric unit.

11. The method according to claim 10, wherein at least one third predetermined trim value is provided.

12. The method according to claim 11, wherein the at least one third trim value is selectively provided to the trimmable electric unit instead of the first and/or second trim values.

13. The method according to claim 10, wherein the at least one trim value is provided by at least one fuse, and the at least one trim value provided by the at least one fuse is sensed, particularly during an initialization period.

14. The method according to claim 11, wherein the at least one third trim value is provided to the electric unit during an initialization period.

15. A device comprising:
    a trimmable electric unit;
    at least one fuse to provide at least one first trim value;
    a first unit running on software to provide at least one second trim value; and
    a control unit to control which of the first and/or second trim values are provided to the electric unit, wherein the first unit and the at least one fuse are monolithically integrated on one substrate.

16. The device according to claim 15, further comprising a second trim value provision unit to provide at least one third predetermined trim value.

17. The device according to claim 16, wherein the control unit further controls if the at least one third trim value is provided to the electric unit.

18. The device according to claim 15, further comprising a sensing unit to sense the at least one trim value stored in the least one fuse.

19. The device according to claim 18, wherein the sensing unit senses the at least one trim value stored in the at least one fuse during an initialization period.

20. The device according to claim 16, wherein during an initialization period the at least one third trim value is provided to the electric unit.

21. The device according to claim 16, wherein the first trim value provision unit further provides a control value to control if the at least one third trim value is provided to the electric unit.

22. The device according to claim 15, wherein the device further comprises a third trim value provision unit using pad multiplexing or blown fuses to provide at least one fourth trim value to the electric unit.

23. The device according to claim 15, wherein the first unit is a microcontroller.

24. A method comprising:
    providing at least one first trim value via at least one fuse;
    providing at least one second trim value via a first unit; and
    controlling which of the first and/or second trim values are provided to a trimmable electric unit, wherein the first trim value provision unit and the at least one fuse are monolithically integrated on one substrate.

25. The method according to claim 24, wherein at least one third predetermined trim value is provided.

26. A device comprising:
    a trimmable electric unit;
    at least one fuse to provide at least one first trim value;
    a first unit to provide at least one second trim value;
    a control unit to control which of the first and/or second trim values are provided to the electric unit, wherein the first unit and the at least one fuse are monolithically integrated on one substrate; and a sensing unit to sense the at least one trim value stored in the at least one fuse during an initialization period.

27. A method comprising:

providing at least one first trim value via at least one fuse;

providing at least one second trim value via a first unit;

controlling which of the first and/or second trim values are provided to a trimmable electric unit, wherein the first trim value provision unit and the at least one fuse are monolithically integrated on one substrate; and sensing the at least one trim value stored in the at least one fuse during an initialization period.

28. A device comprising:

a trimmable electric unit;

at least one fuse to provide at least one first trim value;

a first unit to provide at least one second trim value;

a control unit to control which of the first and/or second trim values are provided to the electric unit, wherein the first unit and the at least one fuse are monolithically integrated on one substrate; and a second trim value provision unit to provide at least one third predetermined trim value, wherein the at least one third trim value is provided to the electric unit during initialization period.

29. A method comprising:

providing at least one first trim value via at least one fuse;

providing at least one second trim value via a first unit;

controlling which of the first and/or second trim values are provided to a trimmable electric unit, wherein the first trim value provision unit and the at least one fuse are monolithically integrated on one substrate; and providing to the trimmable electric unit at least third trim value during an initialization period.

\* \* \* \* \*